United States Patent [19]

Sugiura et al.

[11] Patent Number: 4,896,198
[45] Date of Patent: Jan. 23, 1990

[54] IMAGE RECORDING APPARATUS HAVING WINDOW FOR MAINTENANCE PURPOSE

[75] Inventors: Toshio Sugiura, Nagoya; Osamu Nagata, Aichikamo; Makoto Yamada, Gifu; Tsuyoshi Suzuki, Nagoya, all of Japan

[73] Assignee: Brother Kogyo Kabushiki Kaisha, Aichi, Japan

[21] Appl. No.: 284,692

[22] Filed: Dec. 15, 1988

[30] Foreign Application Priority Data

Dec. 15, 1987 [JP] Japan .............................. 62-191006[U]

[51] Int. Cl.⁴ ...................... G03B 27/32; G03B 27/52
[52] U.S. Cl. ........................................ 355/27; 355/133
[58] Field of Search ........................ 355/27, 28, 29, 30, 355/133, 308; 354/85, 212–216; 271/117, 119, 126, 127; D16/234, 235, 248, 208, 212

[56] References Cited

U.S. PATENT DOCUMENTS 3,695,755 10/1972 Egnaczak .............................. 355/27
4,723,151 2/1988 Sonezaki et al. ...................... 355/27

Primary Examiner—L. T. Hix
Assistant Examiner—Khanh Dang
Attorney, Agent, or Firm—Oliff & Berridge

[57] ABSTRACT

In an image recording apparatus, a pair of support plates are provided in spaced-apart relation and in parallel to each other for rotatably supporting guide rollers for conveying a recording sheet, and a cartridge shaft around which the recording sheet in elongated, web-like form is wound. An outer casing is further provided which accommodates the support plates together with all components necessary for image recording. The casing has one wall arranged in the direction orthogonal to the surfaces of the support plate. A window is provided in that wall to facilitate maintenance of the apparatus.

5 Claims, 2 Drawing Sheets

IMAGE RECORDING APPARATUS HAVING WINDOW FOR MAINTENANCE PURPOSE

BACKGROUND OF THE INVENTION

The present invention relates to an image recording apparatus such as a copying machine or a printer, and more particularly to such an image recording apparatus having a window section for maintenance purpose.

In an image recording apparatus, an original to be copied and an image sheet for copying the image of the original are conveyed or transported from the right side to the left side of the apparatus as viewed from a direction in which the apparatus is disposed in an orientation in which it is used. To this effect, guide rollers are provided for conveying the imaging sheet. The guide rollers are rotatably supported on shafts which are anchored to a pair of frames of the apparatus disposed in parallel in the direction normal to the conveying direction. In a conventional image recording apparatus, a window section is provided for facilitating maintenance of the apparatus. Such a window section is provided in one or both of the frames which supports the shafts of the guide rollers.

However, the provision of the window section in that portion reduces a mechanical strength of the apparatus and causes to distort one or both of the frames, resulting that the parallel positional relationship of the two of the frames is not maintained.

In order to smoothly convey the imaging sheet, the shafts for supporting the guide rollers are required to be arranged in parallel to one another. Otherwise, sheet jamming is caused. Particularly, when conveying an elongated web-like imaging sheet, the sheet is caused to be wrinkled. Therefore, such problems have been raised in the provision of the window section in the frames supporting the shafts of the rollers. Furthermore, in order to maintain a minimum mechanical strength, the size of the window section cannot be made enlarged more than a predetermined maximum notwithstanding the fact that the larger the window section be, the more the maintenance of the apparatus is facilitated.

SUMMARY OF THE INVENTION

In view of the foregoing circumstances, it is an object of this invention to provide an image recording apparatus which is provided with a large area window section for the maintenance purpose, yet providing a sufficient mechanical strength of the apparatus.

In order to achieve the above and other objects, there is provided an image recording apparatus for recording an image of an original on an image recording medium, said apparatus comprising:

a pair of support plates disposed in spaced-apart relation and in parallel with each other;

rollers rotatably bridged between said pair of support plates for conveying the recording medium, each of said rollers having its own axis about which said roller rotates and said axis extending in a direction orthogonal to said pair of support plates;

a casing for accommodating said pair of support plates, said casing having a wall in parallel with said axis and said wall having a window.

DETAILED DESCRIPTION OF THE PREFERRED EMBODIMENTS

A preferred embodiment of this invention will be described below with reference to FIG. 2.

Figure 2:
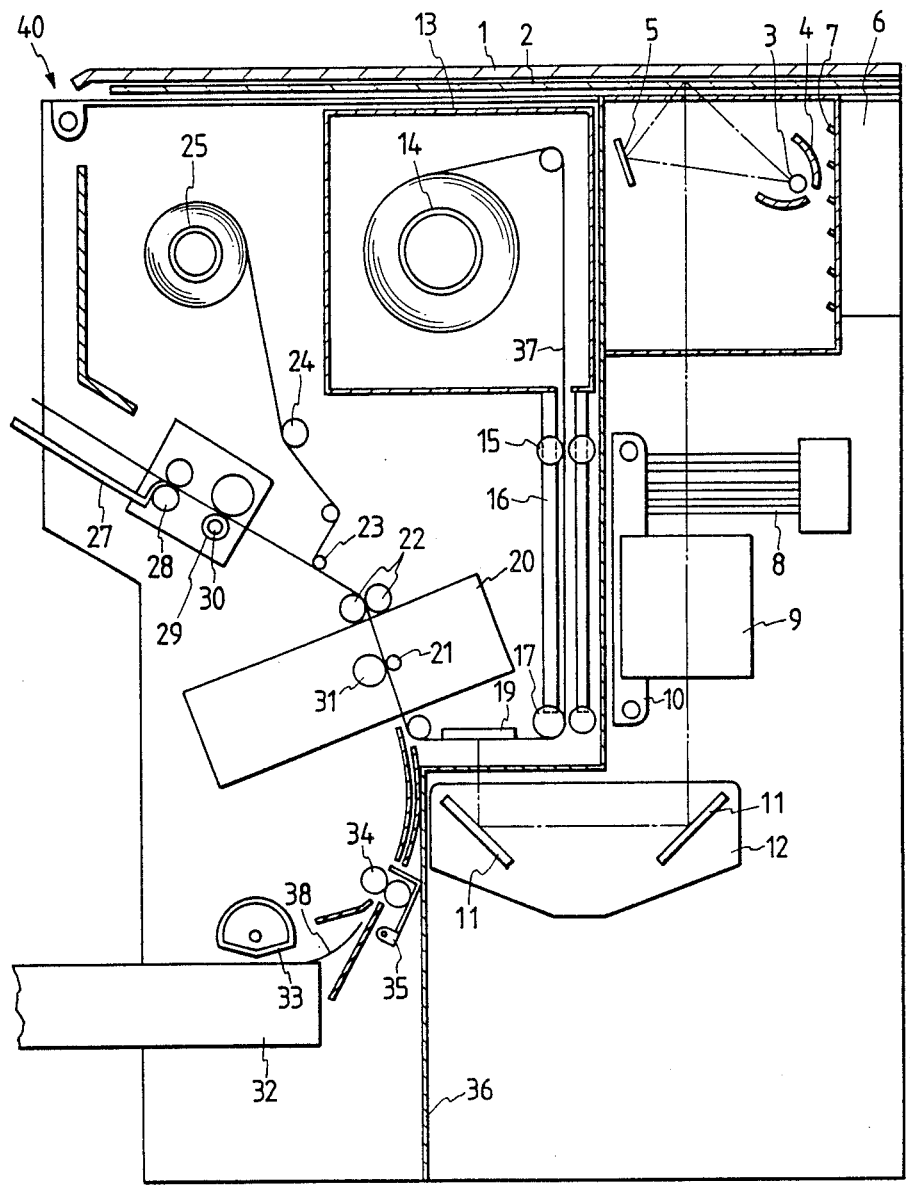
FIG. 2 is a schematic elevational view showing an image recording apparatus according to the present invention.

FIG. 2 shows an image recording apparatus capable of performing a full-color copying. This apparatus employs a transfer type image recording mediums as described in U.S. Pat. No. 4,399,209. The transfer type image recording mediums, such as a photosensitive sheet, which comprises a microcapsule sheet (first image recording medium) and a developer sheet (second image recording medium). More specifically, in the transfer type recording mediums, the developer material is coated on a separate substrate as a separate developer or copy sheet. The first image recording medium comprises a photosensitive pressure-sensitive recording medium provided with microcapsules which encapsulate therein a first material (chromogenic material or dye precursor) having first and second phases dependent on light exposure. The second image recording medium comprises the developer medium provided with a second material (developer material) which provides an output image upon reaction with the first material. Such image recording medium is disclosed in, for example, U.S. Pat. No. 4,399,209.

As shown in FIG. 2, the image recording apparatus 40 generally includes an exposure unit 19 having an exposure stand and a pressure developing unit 20. An exposure zone of the exposure unit 19 is positioned quite adjacent to a developing zone of the pressure developing unit 20 as shown. This closely adjacent positional relationship is advantageous in that a length of a non-treated or margin section of an elongated web-like microcapsule sheet 37, the margin being positioned between a leading pressure developing section of the sheet 37 and the following exposure section thereof, can be minimized, so that the sheet 37 is efficiently used. Such closely adjacent arrangement between the exposure zone and the developing zone will render the entire apparatus 40 compact.

Further, a light shielding partition plate 36 is disposed in the apparatus to divide the internal space of the apparatus into two chambers. That is, an optical system briding from the light source to the exposure unit is disposed within the chamber whereas other requisite units such as the pressure devoping and thermal fixing units are disposed within another chamber.

An elongated web-like microcapsule sheet 37 is wound around a cartridge shaft 14, and is retained in a microcapsule sheet cartridge 13 that is detachably disposed at a position immediately below an original support stand glass 2 and is formed with a bottom opening. The exposure unit 19 is disposed below the sheet cartridge 13 at a downstream side thereof. The sheet 37 passes through a number of rollers and the pressure developing unit 20, and a leading end of the sheet 37 is attached to a take-up shaft 25 positioned beside the sheet cartridge 13.

Between the sheet cartridge 13 and the exposure unit 19, feed roller 15 and a barrel roller 17 are rotatably provided at a vertical sheet path for guide travel of the sheet toward the exposure unit. The microcapsule sheet 37 is transported by a driving unit, such as a motor (not shown). At the downstream side of the exposure unit 19, there is provided the pressure developing unit 20 which includes a small diameter roller 21 and a backup roller 31.

At a lower portion of the apparatus 40, there is provided a developer sheet cassette 32 for storing therein a stack of developer sheets 38. Immediately above the cassette 32, a sector roller 33 is provided to feed the uppermost developer sheet 38 toward the pressure developing unit 20. Between the cassette 32 and the pressure developing unit 20, a roller 34 and a resist-gate 35 are provided so as to align leading edge of the developer sheet 38.

At downstream side of the pressure developing unit 20, a pair of feed rollers 22 are provided so as to feed the sheets fed out from the developing unit 20 at a given speed. At downstream side of the feed rollers 22, a separation roller 23 is provided at which the microcapsule sheet 37 is separated from the developer sheet 37. The separated microcapsule sheet 37 is taken-up by the above mentioned take-up shaft 25 through a meander travel control roller 24. On the other hand, thermal fixing unit 30 is provided at the downstream side of the separation roller 23. The thermal fixing unit 30 includes a hollow heat roller 29 in which a heater element 30 is disposed. Further, a developer sheet feed roller 28 is provided to feed the image fixed developer sheet 38 toward a discharge tray 27.

Next, an optical system and optical path in the copying machine 40 will be described. As shown, the apparatus 40 has its top plate portion provided with a stand cover 1 and the original support stand glass 2. The original support stand glass 2 is formed of a light transmissive material and is movable in the horizontal direction and on which a desired original (not shown) is to be placed with image face down. At the upper one side section (right side in FIG. 2) of the apparatus 40, fixedly provided is a light source including a linear halogen lamp 3 extending in the direction perpendicular to the moving direction of the original support stand glass 2, and a semicylindrical reflector 4 disposed to surround the lamp 3. The light source emits a linear-line light ray to the original support stand glass 2.

Therefore, the light emitted from the halogen lamp 3 can be sequentially irradiated onto the entire surface over the region from the one to another ends of the original support stand glass 2 in accordance with the horizontal movement of the glass 2. The light from the light source passes through the transparent original support stand glass 2 and is reflected upon the original mounted thereon. The original support stand cover 1 which covers the top surface of the glass 2 is provided in order to prevent this light from leakage out of the apparatus.

To irradiate the light from the halogen lamp 3 onto the original at a high efficiency, a flat reflector 5 is disposed on one side of the light source. The flat reflector 5 is disposed to reflectingly direct lights which are not directed toward the original from the light source and concentrate such reflected light onto the original.

At another side of the halogen lamp 3 there are provided a fan 6 and a louver 7 for introducing an external air into the apparatus. Accordingly, air is effectively impinged onto the light source to cool the same.

A filter 8 is disposed below the the light source unit including the halogen lamp 3. A lens unit 9 is provided further below the filter 8. Light emitted from the halogen lamp 3 and reflected upon the original placed on the original support stand glass 2 passes through the filter 8 and enters the lens 9. The filter 8 alters the light transmissive characteristic in accordance with the sensitivity characteristics of the microcapsule sheet 37, to thereby adjust the color tone of a copied output image. The lens 9 is fixedly secured to a lens mounting plate 10, and fine angular adjustment of this lens with respect to a lgiht path is achievable.

A pair of reflection mirrors 11 are provided below the lens 9. The condensed lights passing through the lens 9 change their direction by 180 degrees (completely reverse direction) by the two reflection mirrors 11, and the thus oriented lights impinge on the microcapsule sheet 37 closely contacting the bottom of the exposure table 19 to form the latent image thereon. The two reflection mirrors 11 are securely mounted on a plate 12. The mirror mounting plate 12 is fixedly secured to the main frame 41 of the apparatus 40, so that the adjustment of the length of the light path and focusing adjustment can be effected by fine adjustment of the position of the mirror mounting plate 12. The original (not shown), the filter 8, the lens 9, the pair of reflection mirrors 11 and the exposure table 19 define a U-shape or J-shape light path in combination. That is, the optical path is bent into U-shape or J-shape so as to have a first vertical path directing downwardly, a second path directing horizontally and a third path directing upwardly. At the first optical path, a light reflected from the original is oriented downwardly, and at the third path the reflected light is directed toward the imaging surface of the photosensitive pressure-sensitive recording medium at the exposure zone, and the reflection mirror unit is disposed at the second optical path extending in horizontal direction. As a result, the mirror mounting plate 12 is adjustably movable in a direction parallel to the light path passing through the lens 9. Further, when the mirror mounting plate 12 is vertically moved by a certain distance, the total light path distance is increased by a distance twice as long as the certain distance, yet focussing position at the exposure zone is maintained unchanged, since these mirrors can be moved in a direction parallel with the optical axis.

Operation of the copying apparatus will be described.

The microcapsule sheet 37 taken out from the opening of the cartridge 13 is fed by the feed rollers 15 and guided by the barrel roller 17. The sheet 37 then travels beneath the exposure table 19 while contacting a lower face of the exposure table 19 where original image carrying light is applied to the sheet 37, so that a latent image is formed on the sheet 37.

More specifically, the original support stand cover 1 is lifted up for mounting the original on the original support stand. glass 2. Then, when a start button (not shown) is depressed, the original support stand glass 2 is moved rightwardly to a position where the leftmost edge of the glass 2 is irradiated by the light from the light source 3. The original support stand glass 2 is then moved leftwardly at a constant speed while being irradiated by the light from the halogen lamp 3. The light emitted from the halogen lamp 3 is reflected upon the original, and the reflected light passes through the filter 8 and lens 9 and is reflected upon two reflection mirrors 11. The last reflected light is finally directed toward the microcapsule sheet 37 which is located under the exposure table 19 to form the latent image on the sheet 37. At this time, the microcapsule sheet 37 is leftwardly moved under the exposure table 19 at the same speed as the speed at which the original support stand glass 2 moves.

The sheet 37 is then fed into the pressure developing unit 20. The developer sheets 38 are fed out one by one by the sector or woodruff roller 33, and each sheet 38 is fed to a sheet inlet of the pressure developing unit 20 after leading edge of the sheet 38 is aligned by developer sheet rollers 34 and the resist-gate 35. At the pressure developing unit, the sheet 37 is brought into facial contact with the developer sheet 38. The microcapsule-carrying surface of the microcapsule sheet 37 on which a latent image is formed is in facial contact with the developer-coated surface of the developer sheet 38 at a position inside the pressure developing unit 20, and these superposed sheets are pressed together by the small roller 21 and the backup roller 31. Unexposed microcapsules are ruptured under the applied pressure to thereby form an output image on the developer sheet 38 because of the reaction of chromogenic material with the developer material.

Both the microcapsule sheet 37 and the developer sheet 38 are fed out of the pressure developing unit. The microcapsule sheet 37 and developer sheet 38 leaving the pressure developing unit 20 are fed out by the feed rollers 22 and are separated by the separation roller 23, the former sheet 37 directing upward and the latter sheet 38 directing in the straight direction.

Thereafter, the developer sheet 38 is subjected to thermal fixing in the thermal fixing unit 30 and is then discharged onto the discharge tray 27 with its image surface up. The microcapsule sheet 37 leaving the pressure developing unit 20 and passing through the separation roller 23 and the meandering control roller 24 is wound around the take-up shaft 25. When the movement of the original support stand glass 2 is stopped at a second position where another edge (right side in FIG. 2) of the glass 2 confronts the the light source, the copying of the original is completed and the halogen lamp 3 is turned off.

Figure 3:
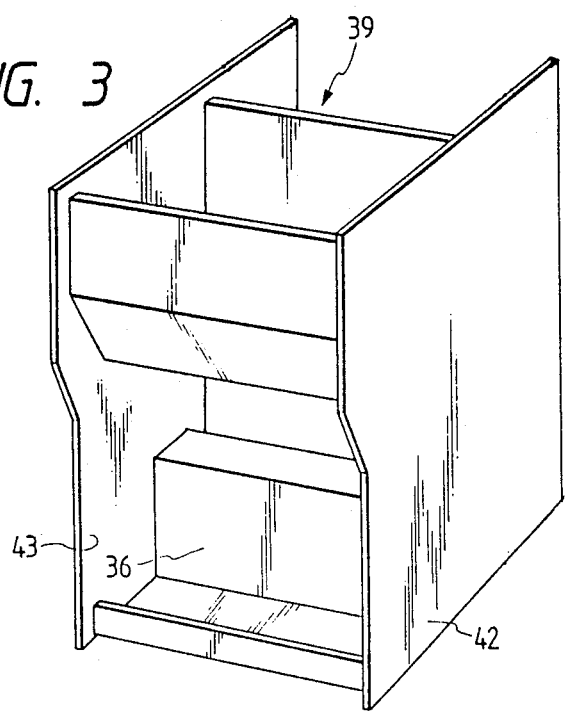
FIG. 3 is a perspective view showing a frame of the image recording apparatus according to the embodiment of the present invention.

In the above described apparatus, the take-up shaft 25 and the various kinds of guide rollers, such as the rollers 15, the barrel roller 17 are rotatably supported on frame plates 42 and 43 of a frame assembly 39 disposed in spaced-apart relation and in parallel with each other. Both ends of the cartridge shaft 14 are connected to roll supporting shafts (not shown) each provided on each of the frame plates 42 and 43, detailed description of which is disclosed in copending U.S. patent application Ser. No. 281215 (corresponding to Japanese Utility Model application Nos. 62-191014 and 62-17646) entitled "IMAGE RECORDING APPARATUS FEASIBLE FOR REPLACEMENT OF IMAGE RECORDING MEDIUM" by Tsuyoshi SUZUKI ET AL. The frame assembly 39 further includes, as shown in FIGS. 2 and 3, a partition plate 36. The partition plate 36 serves not only to divide the internal space of the apparatus into two chambers, one accommodating an optical unit and the other accommodating the remaining units but also to reinforce the frame plates 42 and 43.

Figure 1:
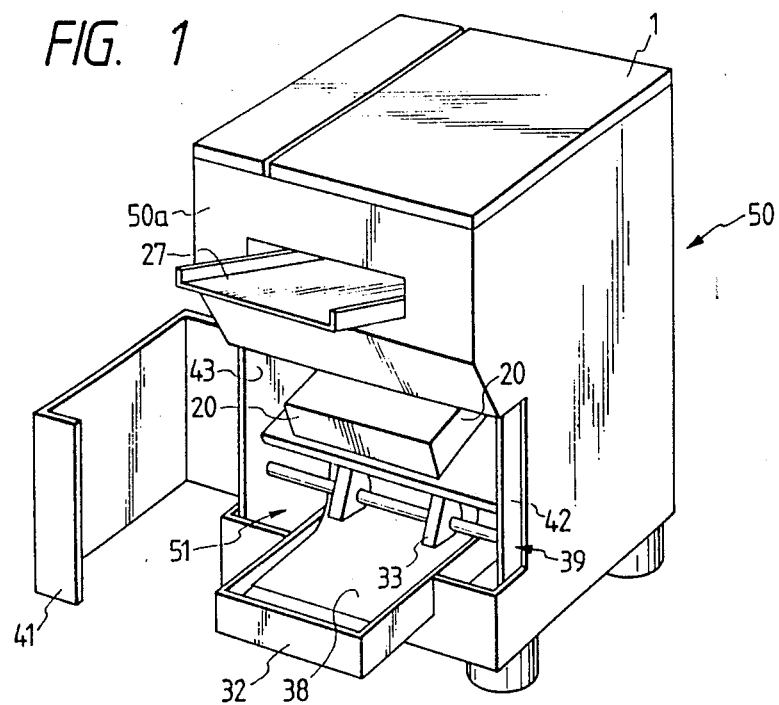
FIG. 1 is a perspective view showing an image recording apparatus according to an embodiment of the present invention.

As shown in FIG. 1, the frame assembly 39 is accommodated in a casing 50. A face 50a of the casing 50 is provided with a window section 51 and a door 41 which is coverable the window section 51. As is apparent from the drawings, the window section 51 is provided in the face where no plates or shafts are attached, so that with the opening of the door 41, the entire conveying path for the developer sheet 38 is exposed. As such, the operability of the apparatus for its maintenance is greatly improved. Although not shown in the drawings, there is also a door at the opposite side of the face 50a to ensure the maintenance of the optical unit.

As described above, according to this invention, a large window section is provided to facilitate the maintenace of the apparatus and relieve a user of the troublesome operation involved in the maintenance. Further, since no opening needs to be formed in that side of the frame of the apparatus which supports rollers, the mechanical strength of that side will not be weakened, thus preventing the rollers or the like from being deformed or shaking. This further prevents the imaging sheet in motion from wrinkling or being jammed.

While the invention has been described with reference to specific embodiment thereof, it would be apparent for those skilled in the art that various changes and modifications can be made therein without departing from the spirit and scope of the invention. For example, the foregoing embodiment concerns the image recording apparatus using the photosensitive pressure sensitive recording medium. However, the present invention is also available for other type of recording apparatuses which record images using tone particles.

What is claimed is:

1. An image recording apparatus for recording an image of an original on an image recording medium, said apparatus comprising:
   a pair of support plates disposed in spaced-apart relation and in parallel with each other;
   rollers rotatably bridged between said pair of support plates for conveying the recording medium, each of said rollers having its own axis about which said roller rotates and said axis extending in a direction orthogonal to said pair of support plates;
   a casing for accommodating said pair of support plates, said casing having a wall in parallel with said axis and said wall having a window.

2. An image recording apparatus as defined in claim 1, further comprising a door pivotally secured to said casing to cover said window.

3. An image recording apparatus as defined in claim 2, further comprising a partition plate having two ends connected to said pair of support plates, said partition plate dividing a space defined by said pair of support plates into a first chamber and a second chamber.

4. An image recording apparatus as defined in claim 3, further comprising:
   a light source for irradiating light onto said original;
   an exposure unit for exposing said image recording medium to light to form a latent image on said image recording medium;
   an optical unit for receiving light reflected from said original and directing the light toward said exposure unit; and
   a developing unit for developing said latent image to provide a visible image.

5. An image recording apparatus as defined in claim 4, wherein said light source, said exposure unit and said optical unit are accommodated in said first chamber and said developing unit is accommodated in said second chamber.

* * * * *